(12) United States Patent
Schimetta et al.

(10) Patent No.: US 8,642,465 B2
(45) Date of Patent: Feb. 4, 2014

(54) METHOD FOR MANUFACTURING AND MAKING PLANAR CONTACT WITH AN ELECTRONIC APPARATUS, AND CORRESPONDINGLY MANUFACTURED APPARATUS

(75) Inventors: Gernot Schimetta, München (DE); Maximilian Tschemitz, Freising (DE)

(73) Assignee: Siemens Aktiengesellschaft, Munich (DE)

( * ) Notice: Subject to any disclaimer, the term of this patent is extended or adjusted under 35 U.S.C. 154(b) by 1247 days.

(21) Appl. No.: 12/224,608

(22) PCT Filed: Dec. 21, 2006

(86) PCT No.: PCT/EP2006/070110
§ 371 (c)(1),
(2), (4) Date: Sep. 2, 2008

(87) PCT Pub. No.: WO2007/098820
PCT Pub. Date: Sep. 7, 2007

(65) Prior Publication Data
US 2009/0026602 A1    Jan. 29, 2009

(30) Foreign Application Priority Data
Mar. 2, 2006   (DE) .......................... 10 2006 009 723

(51) Int. Cl.
*H01L 21/4763* (2006.01)
(52) U.S. Cl.
USPC ........... 438/619; 438/107; 438/666; 257/690; 257/735; 257/736; 257/E23.013; 257/E23.014; 257/E23.169; 257/E23.175; 257/E21.505

(58) Field of Classification Search
USPC .......... 438/619, 666, 107, 690; 257/735, 736, 257/E23.013, E23.014, E23.169, E23.175, 257/E21.505, 690
See application file for complete search history.

(56) References Cited

U.S. PATENT DOCUMENTS

| | | | |
|---|---|---|---|
| 3,325,882 A * | 6/1967 | Charles Chiou et al. ...... | 438/120 |
| 3,568,012 A * | 3/1971 | Ernst et al. .................... | 257/786 |
| 3,735,485 A * | 5/1973 | Wilson ............................ | 29/838 |
| 3,903,590 A * | 9/1975 | Yokogawa ..................... | 438/107 |
| 4,026,759 A * | 5/1977 | McBride et al. ................ | 216/20 |
| 4,189,825 A * | 2/1980 | Robillard et al. ................ | 438/4 |

(Continued)

FOREIGN PATENT DOCUMENTS

| | | |
|---|---|---|
| EP | 1304742 A2 | 4/2003 |
| EP | 1381080 A2 | 1/2004 |
| EP | 1755162 A2 | 2/2007 |
| WO | WO 03030247 A2 | 4/2003 |

*Primary Examiner* — Fernando L Toledo
*Assistant Examiner* — Victoria K Hall
(74) *Attorney, Agent, or Firm* — Staas & Halsey LLP

(57) ABSTRACT

Reliable electrical contact is made with electronic components and effective electrical isolation is produced between the top and bottom of the electronic components. An electronic component is arranged inside a window in a first layer on a substrate. Next, a second layer is put on such that contact areas on the component and contact points on the first layer are freely accessible. Electrical contacts and electrical connecting lines are produced by electrodeposition. The second layer is used to produce bridges over an interval range between the electronic component and the first layer. The bridges have connecting lines formed on them. The second layer can be removed again. Radio-frequency modules can be produced in compact fashion and can be combined with audio-frequency components.

18 Claims, 6 Drawing Sheets

(56) References Cited

U.S. PATENT DOCUMENTS

| | | | | |
|---|---|---|---|---|
| 4,312,117 A * | 1/1982 | Robillard et al. | | 438/107 |
| 4,717,988 A * | 1/1988 | Landis | | 361/767 |
| 4,783,695 A * | 11/1988 | Eichelberger et al. | | 257/668 |
| 4,784,972 A * | 11/1988 | Hatada | | 228/180.21 |
| 5,198,385 A * | 3/1993 | Devitt et al. | | 438/233 |
| 5,206,712 A * | 4/1993 | Kornrumpf et al. | | 361/729 |
| 5,255,431 A | 10/1993 | Burdick | | |
| 5,279,706 A * | 1/1994 | Balch et al. | | 216/15 |
| 5,291,066 A * | 3/1994 | Neugebauer et al. | | 257/750 |
| 5,302,547 A * | 4/1994 | Wojnarowski et al. | | 216/41 |
| 5,455,459 A * | 10/1995 | Fillion et al. | | 257/760 |
| 5,530,282 A * | 6/1996 | Tsuji | | 257/666 |
| 5,564,181 A | 10/1996 | Dineen | | |
| 5,605,863 A * | 2/1997 | Wills et al. | | 438/122 |
| 5,994,648 A | 11/1999 | Glovatsky | | |
| 6,166,333 A * | 12/2000 | Crumly et al. | | 174/255 |
| 6,229,203 B1 * | 5/2001 | Wojnarowski | | 257/668 |
| 6,309,912 B1 * | 10/2001 | Chiou et al. | | 438/118 |
| 6,400,573 B1 * | 6/2002 | Mowatt et al. | | 361/719 |
| 6,998,533 B2 * | 2/2006 | De Samber et al. | | 174/521 |
| 7,317,251 B2 * | 1/2008 | Meyer-Berg | | 257/724 |
| 7,396,700 B2 * | 7/2008 | Hsu | | 438/107 |
| 2002/0036345 A1 * | 3/2002 | Iseki et al. | | 257/734 |
| 2004/0152242 A1 * | 8/2004 | Wong | | 438/125 |
| 2005/0032347 A1 | 2/2005 | Amigues Laurence | | |
| 2006/0024900 A1 * | 2/2006 | Lee | | 438/381 |
| 2007/0238056 A1 * | 10/2007 | Baumann et al. | | 430/325 |

\* cited by examiner

METHOD FOR MANUFACTURING AND MAKING PLANAR CONTACT WITH AN ELECTRONIC APPARATUS, AND CORRESPONDINGLY MANUFACTURED APPARATUS

CROSS REFERENCE TO RELATED APPLICATIONS

This application is based on and hereby claims priority to German Application No. 10 2006 009 723.8 filed on Mar. 2, 2006 and PCT Application No. PCT/EP2006/070110 filed on Dec. 21, 2006, the contents of which are hereby incorporated by reference.

BACKGROUND OF THE INVENTION

This invention concerns a method for manufacturing and making planar contact with an electronic apparatus, in particular a high frequency module.

Mass production of radar modules on the basis of bare chip processing, in particular for an operating frequency of 77 GHz, traditionally uses so-called wire bonding methods. Operating frequencies in the 77 GHz range are used, in particular, for so-called long range radar, e.g. as the basis for longitudinal vehicle control. Traditional wire bonding provides only slight process reliability of the chip contacting technology which is used. Traditional wire bonding has a big effect on costs. In the wire bonding process, which disadvantageously is serial, wire bonds, with lengths e.g. from 0.3 mm to 0.4 mm, are to be produced with a precision of, for example, about ±5%. Because of the numerous contacting points in a traditional radar module, the unit costs are very high. Despite some system advantages, therefore, the so-called 77 or 79 GHz radar technology has disadvantages compared with competing technologies such as LIDAR (which is based on scanning the environment by a radar beam). The costs of production (assembly) cause the greater part of the system costs. In particular for Europe, a change from 24 GHz technology to 79 GHz technology seems necessary. There is therefore a need for inexpensive packaging solutions. Monolithic systems, in which the whole radar front end is combined on one chip, also seem not to be available in the near future. Use of the so-called flip-chip technology seems disadvantageous because of the stimulation of oscillation modes between chip and substrate and bad heat spreading. Use of the surface mount technology (SMT) which is traditional for 24 GHz radar modules is also disadvantageous, because of the high frequencies which are used. According to the related art, thinned HF (high frequency) chips are glued very precisely to a substrate board using an electrically conducting adhesive. For this purpose, from the insulating film which covers the whole surface of the board, an opening or window for the chip is cut by laser. This window is slightly larger than the chip, resulting in a narrow surrounding gap. The surrounding air gap ensures potential isolation between the upper and lower sides of the chip (earth), without parasitic capacitances. The chip and insulating film have approximately the same thickness. All HF (and LF) signal lines are on the insulating film, and so are all supply lines. According to the traditionally used wire bonding process, the chip pad and HF line are connected to each other. In some circumstances, direct chip-to-chip connections can also be implemented.

According to the related art, an insulating film is put onto a substrate board. At least one window for at least one chip is lasered into the insulating film. A thinned HF chip is glued onto the substrate board in the window using an adhesive. According to the traditional method, contacting areas of the chip and electrical lines on the insulating film are contacted by wire bonding. Traditional wire bonding must be carried out serially, and therefore has a big effect on costs and is very slow.

SUMMARY

It is therefore an object to produce electronic apparatuses, in particular high frequency modules, inexpensively, electronic components such as semiconductor chips and passive components (capacitors, resistors, inductors) being reliably electrically contacted, and an effective potential isolation between the upper and lower sides of the electronic components being produced.

The method uses substrates which include copper and/or aluminum. So-called LTCC (low temperature cofired ceramic) substrates can also be used. Opening at least one window for at least one electronic component such as a (semi-)conductor) chip in the first layer is done by a laser, for example. Below, in this description, "semiconductor chip" or "chip" is written, and these should be seen as examples of general "electronic components". A semiconductor chip can be fixed in an opening or window using adhesive. The second layer is used, in particular, for electrical insulation. In particular, the second layer bridges the gap area.

The traditional extremely short bond wires are replaced by connections which are, for example, deposited galvanically by vapor deposition or sputtering. Electrically conducting material can be applied galvanically by vapor deposition or sputtering. To support bridges over the air gap which surrounds the semiconductor chips or chips, or for insulation, a plastic film, in particular a polymer film, is stretched over the semiconductor chip. The contacting points of the semiconductor chip can be opened by photolithography or a laser process. According to the proposed method, electronic apparatuses, in particular high frequency modules, can be produced inexpensively in mass production. Parallel, stable processes for semiconductor chip contacting are created. In this way, assembly costs are effectively reduced. It is also advantageous that the number of contacts on a module has no effect on the contacting costs, which depend only on the area of a module. Specially advantageously, because of the more precise and shorter gaps between semiconductor chip and high frequency lines on the substrate, higher signal integrity is provided. According to the proposed method, contacting of components at different heights, e.g. capacitors and semiconductor chips, is also possible. Similarly, by the second layer, physical and/or chemical protection for the semiconductor chip can be provided. Further advantages are:

Opening the second layer is possible at every point. The only exception is the gap surrounding the semiconductor chip. In this way, positioning bond contacting areas on the edge of the semiconductor chip is unnecessary. Building very compact and therefore inexpensive high frequency modules is possible. The only physical limit is the mutual influence of high frequency lines. Electronic apparatuses which, for example, make it possible to integrate antennas can be produced. Cost-effective encapsulation of the whole electronic apparatus, in particular of a high frequency module, is also possible. High frequency modules with considerably reduced dimensions can be produced. In this way, for example, so-called automotive radar can be more easily integrated in a motor vehicle. For example, integration in a motor vehicle fender is possible. New fitting locations can also be used. It is also possible to use proposed methods and proposed electronic apparatuses with the so-called surface mounted device (SMD) technology, in particular in the low frequency part. Smaller components can be integrated under the second layer, and larger components can be fitted and connected to it.

According to an advantageous embodiment, the second layer is a plastic film, which is applied over the whole surface, e.g. by deep drawing or lamination. This plastic film is opened over the at least one contacting area of the at least one semiconductor chip and the at least one contacting point of the at least one electrical line. The opening can be done by laser ablation (planar opening), for example. Reference is made here to WO 03/030247, which discloses a method of planar contacting of electrical contacting areas of a substrate and an apparatus from a substrate with electrical contacting areas. According to this method, a film of electrically insulating plastic material is laminated onto the surface of a substrate under vacuum, in such a way that the film closely covers the surface with the contacting area(s), and adheres to this surface. Each contacting area to be contacted on the surface is uncovered by opening appropriate windows in the film. Finally, planar contacting of each uncovered contacting area takes place with a layer of electrically conducting material.

According to a further embodiment, the second layer is a photostructured layer. The second layer is produced as an electrically insulating film, in particular a plastic film or lacquer. By photolithography, a layer which can be photostructured, a plastic film or a lacquer, is exposed and developed. The photostructured layer is produced so that contacting areas and contacting points remain uncovered.

According to a further advantageous embodiment, the second layer can be removed after the galvanic deposition. If a plastic film or a film of electrically insulating plastic material is used, the second layer can be removed by laser. If a photostructured layer is used, the second layer can be specially simply and inexpensively removed using a chemical solution. If the second layer is a film of electrically insulating plastic material, with appropriate semiconductor chip passivation, this film on the semiconductor chip can be removed on the whole electrically active area by laser, if this is more advantageous corresponding to the high frequency conditions. Only a film frame, or optionally a thin residual layer of the film, remains in the electrically active semiconductor chip area.

According to a further advantageous embodiment, galvanic deposition includes the following steps. A galvanic substrate metallization can be applied over the whole area by sputtering (cathode atomization) or vapor deposition. A substrate metallization can be a titanium layer, on which a tungsten-titanium layer is arranged, with a copper layer applied on it in turn. The tungsten-titanium layer provides a diffusion barrier. In traditional sputtering, in a vacuum chamber, a substrate which is arranged between two plate-shaped electrodes is bombarded with, for example, copper ions. According to a second step, a photostructured covering layer is applied. This covering layer can be a film or a layer of lacquer. Photostructuring takes place by photolithography and the steps of spraying on the covering layer, exposure and development of the covering layer. Electroplatable areas which are not covered by the generated covering layer correspond to electrical connecting lines, contacting areas and contacting points. Next, the uncovered areas are electroplated. In this case the arrangement which has been generated until now is dipped into an electrolyte. For example, a sequence of copper, nickel and gold layers can be generated, the gold layer being the upper layer, and the copper layer being the layer which is applied directly to the galvanic substrate metallization. The nickel layer provides a diffusion barrier. Finally, the covering layer is removed. In particular, this can be done by a chemical solution. The galvanic substrate metallization which has not been electroplated is then removed. This can be done using an acid or basic solution, for example.

According to a further advantageous embodiment, the height of the at least one semiconductor chip and the thickness of the first layer are approximately equal. In this way, a gap area between the semiconductor chip and the first layer can easily be bridged by the second layer.

According to a further advantageous embodiment, the second layer is merely a layer with a high attenuation factor, meaning that materials which are less expensive but disadvantageous in high frequency conditions can also be used. This is possible because only short distances between the semiconductor chip contacting area and high frequency lines on the module substrate have to be bridged.

According to a further advantageous embodiment, the connecting lines are produced as connecting lines from semiconductor chip to substrate, from semiconductor chip to semiconductor chip, from semiconductor chip to a passive component and/or from passive component to passive component.

According to a further advantageous embodiment, under the second layer at least one surface mounted device component is integrated. This is specially advantageous if a laminated film is used as the second layer. This film can also be laminated via an adjacent, inexpensive low frequency base substrate, e.g. a control board, a window section, the high frequency substrate. Junctions between low frequency and high frequency areas of a substrate or board can also be produced in the same process. The method costs increase according to the additional substrate area to be processed. It is also possible to put surface mounted device components which are not to be integrated under the film onto the film subsequently. The contacting areas are opened by laser after the contacting areas are opened. Here it is specially advantageous if the previously produced module can be provided with solder on the contacting areas, and this solder can be remelted in a single, common heating process (reflow), without damaging the previously produced module. This means that some reflow capability must be present. If there is none, gluing techniques, solders which melt at low temperatures, in particular stepped soldering or selective soldering methods, e.g. by laser, must be used.

According to a further advantageous embodiment, the second layer (8) is opened and at least one surface mounted device (SMD) component is put on. It can be put on the first layer and/or on an electronic component.

According to a further advantageous embodiment, after the electroplating step on the second layer, a third layer 14 is applied onto the surface 30 of existing features, as exemplarily illustrated in FIGS. 1 and 3. This third layer can be an electrically insulating plastic film, for instance. It can also be metallized and used as electromagnetic compatibility (EMC) protection. The third layer can also produce hermetic encapsulation.

According to a further advantageous embodiment, further line planes are applied on the second layer. The further line planes can be applied sequentially. The result is "buried" (high frequency) chips.

According to a further advantageous embodiment, by applying electrically conducting material to the contacting area and/or contacting point, a distributed electronic component is generated. These components can be merely areas which form a high frequency component. Concentrated components, in contrast, are capacitors, for example.

According to a further advantageous embodiment, the use of films which have a low attenuation factor as second layers is also possible. Thus the electroplated connecting structures are also suitable for relatively large areas around semiconductor chips. In this way, a complete new line plane is available, and makes higher integration and more complex high frequency structures possible. This concerns the use of microcoaxial lines, for example.

An advantageous apparatus, in particular a high frequency module, has at least one electronic component, which is arranged on a substrate and within at least one window of a first layer, in such a way that a gap area between the electronic component and the first layer and/or between adjacent electronic components is generated, at least one electrical line with at least one electrical contacting point being generated on the first layer and/or on the substrate, and at least one electrical contacting area being generated on the electronic component, and has a second layer on the electronic component, on the first layer and over the gap areas, at least one planar electrical connecting line, which is arranged on the second layer, being generated through openings in the second layer, to connect contacting areas, contacting areas and contacting points, and/or contacting points.

According to an advantageous apparatus, the second layer, which is arranged over the gap area and under an electrical conducting line, is removed.

According to a further advantageous apparatus, on the second layer and open contacting areas and/or open contacting points, at least one distributed electronic component is generated. These components can be merely areas which form a high frequency component. Concentrated components, in contrast, are capacitors, for example.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
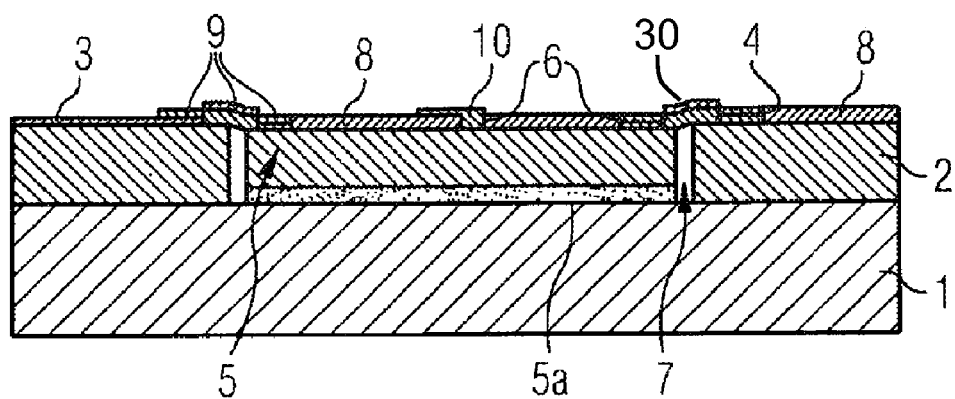
FIG. 1 shows a first exemplary embodiment of a generated electronic apparatus.

Reference will now be made in detail to the preferred embodiments of the present invention, examples of which are illustrated in the accompanying drawings, wherein like reference numerals refer to like elements throughout.

FIG. 1 shows a first exemplary embodiment of an electronic apparatus which is generated according to the proposed method. A substrate is marked with the reference symbol 1. A first layer 2 has been applied to the substrate 1. The first layer 2 can be an electrically insulating film. On the first layer, electrical lines 3 with contacting points 4 are generated. After the first layer 2 is opened and a window is generated, a semiconductor chip (or passive component) 5 has been fixed on the substrate 1. The semiconductor chip 5 is fixed on the substrate 1 by an adhesive 5a. Between the first layer 2 and the semiconductor chip 5, which is arranged on the adhesive 5a, a gap area 7 or gap is generated. The semiconductor chip 5 has at least one electrical contacting area 6. This is on the semiconductor chip 5, on the side facing away from the substrate 1. Between the fixed semiconductor chip 5 and the first layer 2, a gap area 7 or gap is formed. On the semiconductor chip 5, on the first layer 2 and over the gap area 7, a second layer 8 is arranged so that the contacting areas 6 and contacting points 4 are freely accessible. The second layer 8 can be an electrically insulating film, e.g. with a thickness of 20 µm. The second layer 8 can also be a film or lacquer which can be photostructured. Between the contacting areas 6 of the semiconductor chip 5 and the contacting points 4 of the electrical lines on the first layer 2, electrical connecting lines 9 are electroplated. FIG. 1 shows an electronic apparatus such as a high frequency module, which has been produced according to method. This electronic apparatus has been produced according to a method according to FIG. 4. FIG. 1 shows a so-called distributed electronic component 10. This is produced merely as an area which has a high frequency effect, for example. This component lies on the second layer 8.

Figure 2:
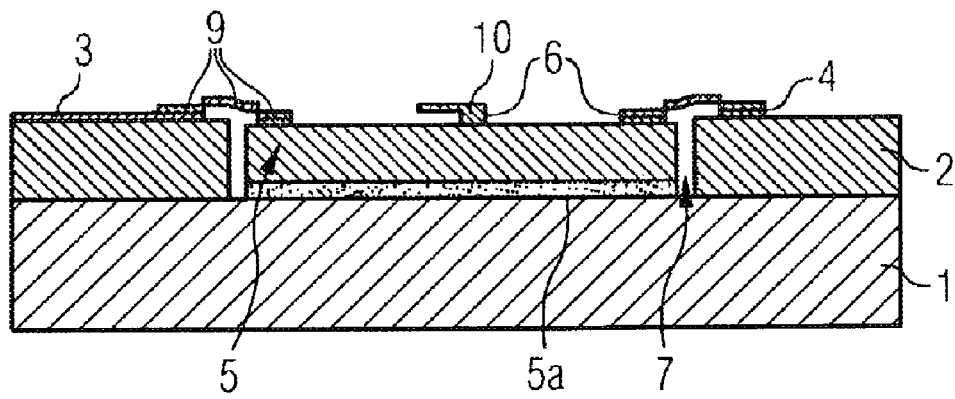
FIG. 2 shows a second exemplary embodiment of a generated electronic apparatus.

FIG. 2 shows a further exemplary embodiment of an electronic apparatus which has been produced according to the proposed method, in particular a high frequency module. The same reference symbols as FIG. 1 show the same components of the electronic apparatus. In contrast to FIG. 2, the second layer 8 has been removed. The second layer 8 can be a plastic film or a lacquer. According to the exemplary embodiment according to FIG. 1, the second layer 8, over the gap areas 7, forms a support or bridge for the electrical conducting lines 9. The second layer 8 can also be used as electrical insulation. The second layer 8 over the gap areas 7 can be seen as dielectrics. Thus a dielectric component is added to the potential isolation between the upper and lower sides of the semiconductor chip 5. In this area, the second layer 8 acts as dielectrics and thus capacitively. Thus the potential isolation between the upper and lower sides of the semiconductor chip 5 is made worse. According to FIG. 2, the second layer 8 is removed over the gap areas 7. Thus the potential isolation between the upper and lower sides of the semiconductor chip 5 is improved. According to the embodiment according to FIG. 1, the second layer 8 is retained, to avoid a step of removing the second layer 8. This is economical. The second layer 8 also causes increased mechanical stability of the electrical connecting lines 9 over the gap areas 7. According to the exemplary embodiment according to FIG. 2, the dielectric layer, which is generated by the second layer 8, and was arranged below the connecting line 9 and over the gap area 7, is removed. In this way, the potential isolation between the upper and lower sides of the semiconductor chip 5 is improved compared with the exemplary embodiment according to FIG. 1. A further step, of removing or removing locally the second layer 8, is required. In contrast to exemplary embodiment 2, the mechanical stability of the bridges over the gap areas 7 is improved in FIG. 1.

According to FIGS. 1 and 2, the first layer 2 is in the form of a polymer layer. Also, the semiconductor chip 5 is a chip based on gallium arsenide (GaAs), silicon-germanium (SiGe), silicon carbide (SiC) or silicon. The second layer 8 is also in the form of a polymer layer. The connecting lines 9 are produced galvanically.

Figure 3:
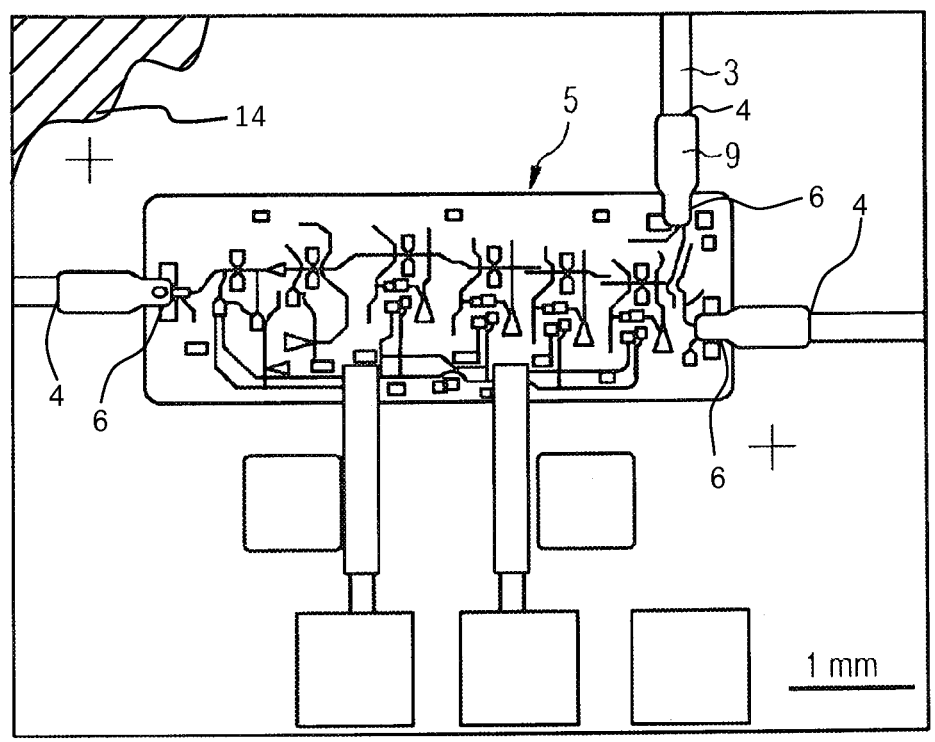
FIG. 3 shows a plan view of a third exemplary embodiment of a generated electronic apparatus.

FIG. 3 shows a plan view of an electronic apparatus which is generated according to the proposed method. The same reference symbols as in FIGS. 1 and 2 are used. The contacting areas 6 of the semiconductor chip 5 are connected electrically by electrical connecting lines 9 to contacting points 4 of electrical lines 3. The electrical lines 3 can be signal lines and/or electrical supply lines.

Figure 4:
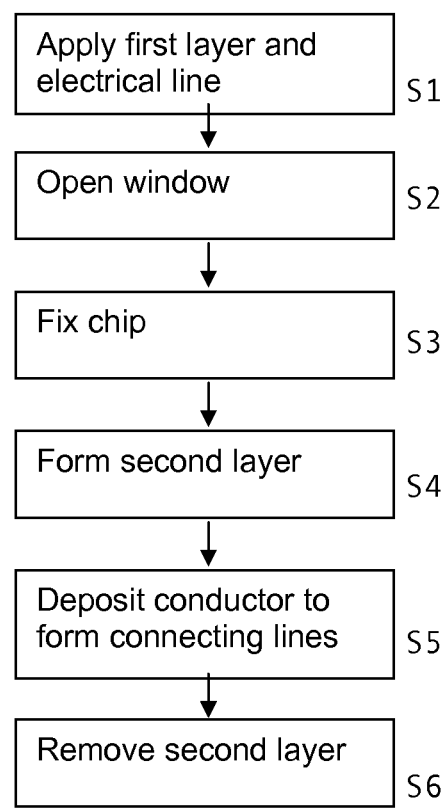
FIG. 4 shows a block diagram of a method according to one potential embodiment of the invention.

FIG. 4 shows a block diagram of the proposed method for producing and contacting an electronic apparatus, in particular a high frequency module. Step S1 designates applying a first layer 2, which is used in particular for electrical insulation, to a substrate 1, at least one electrical line 3 with at least one electrical contacting point 4 being generated on the first layer 2. Step S2 designates opening at least one window for at least one (semiconductor) chip 5 in the first layer 2. Step S3 designates fixing the (semiconductor) chip 5 within the window on the substrate 1, at least one electrical contacting area 6 and one gap area 7 being generated on the semiconductor chip 5 between the semiconductor chip 5 and the first layer 2. Step S4 designates arranging a second layer 8 on a semiconductor chip 5, on the first layer 2 and over the gap area 7 so that the contacting areas 6 and contacting points 4 are freely accessible. Step S5 designates galvanic deposition of electrically conducting material onto the contacting areas 6 and contacting points 4, for planar electrical contacting onto the second layer, in particular plastic film, to generate electrical connecting lines 9 between the contacting areas 6 and contacting points 4. Electrical contacting of contacting areas 6 and contacting points 4 can be done, in particular, by the following steps:

Laminating a second layer 8 of electrically insulating plastic material onto the surfaces of the first layer 2, the semiconductor chip 5 and over gap areas 7 under vacuum, in such a way that the second layer 8, which is, in particular, a film, closely covers the surfaces with the contacting area(s) 6 or contacting points 4, and adheres to this surface. Next, every contacting area 6 and contacting point 4 to be contacted is uncovered on the surface by opening appropriate openings in the second layer 8 or film 8. Finally, the free contacting areas 6 and contacting points 4 are planarly contacted with a layer of electrically conducting material. In this way, planar contacting takes place, and electrical connecting lines 9 between contacting areas 6 and contacting points 4 are generated. In this context, reference should be made again to WO 03/030247, the content of which fully belongs to the disclosure of this application.

Figure 5A:
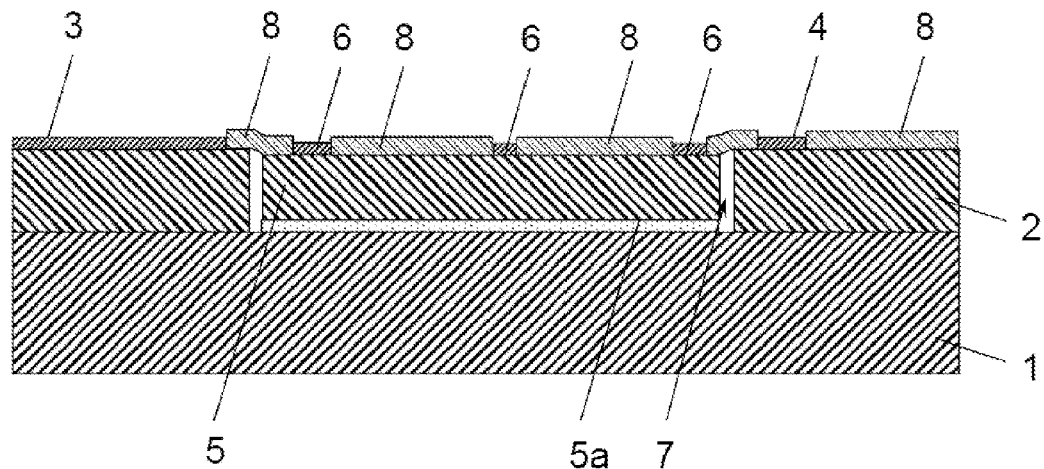
FIG. 5a shows an embodiment of the invention prior to a galvanic deposition process further illustrated in FIGS. 5b-5f.
Figure 5B:
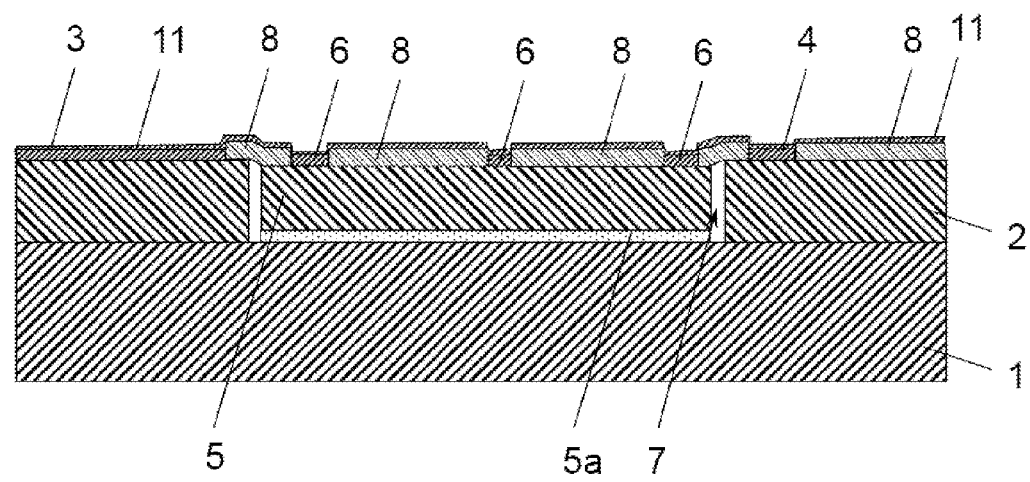
FIG. 5b shows an aspect of the galvanic deposition process in which a galvanic substrate metallization is applied.
Figure 5C:
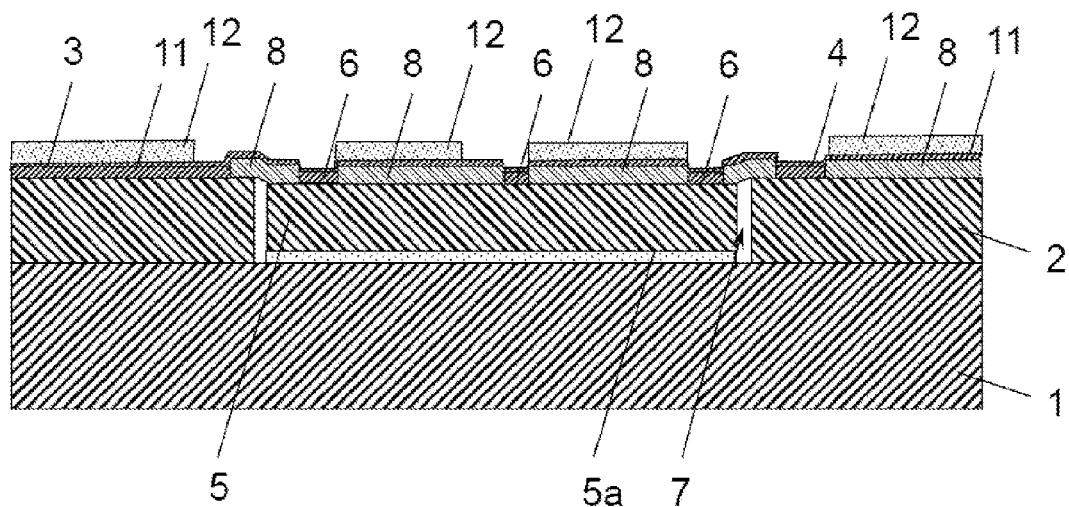
FIG. 5c shows an aspect of the galvanic deposition process in which a photostructured covering layer is applied.
Figure 5D:
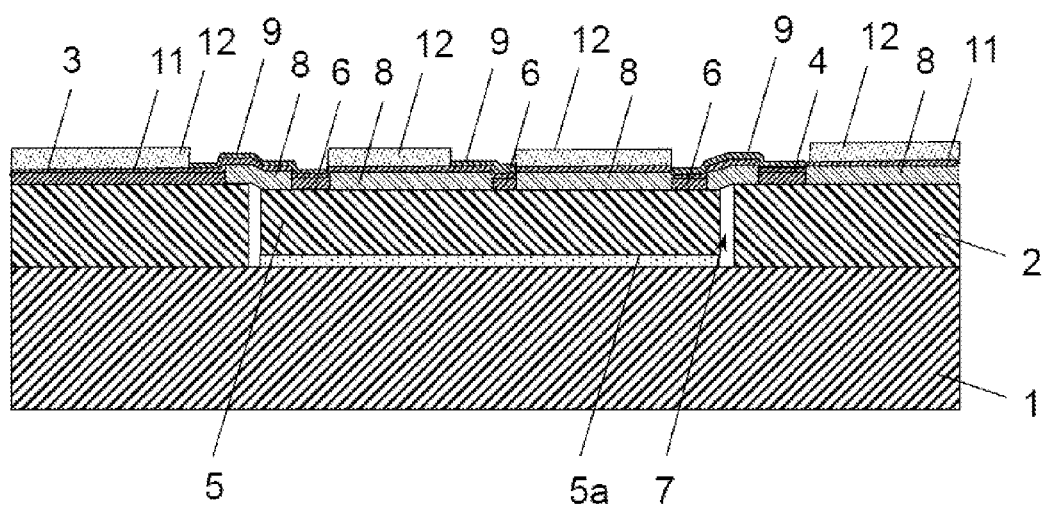
FIG. 5d shows an aspect of the galvanic deposition process in which electroplating is conducted.
Figure 5E:
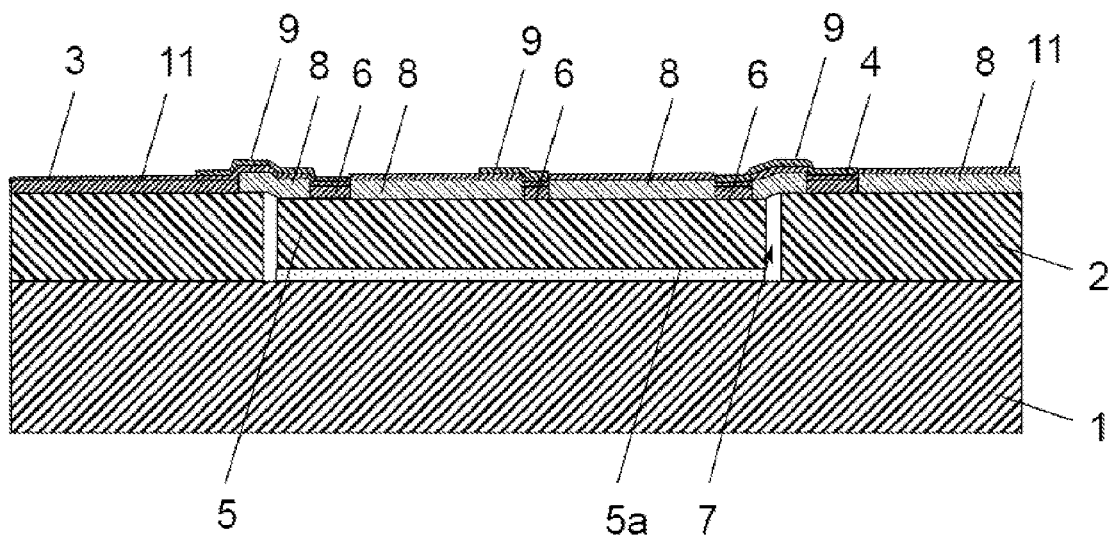
FIG. 5e shows an aspect of the galvanic deposition process in which the covering layer is removed.
Figure 5F:
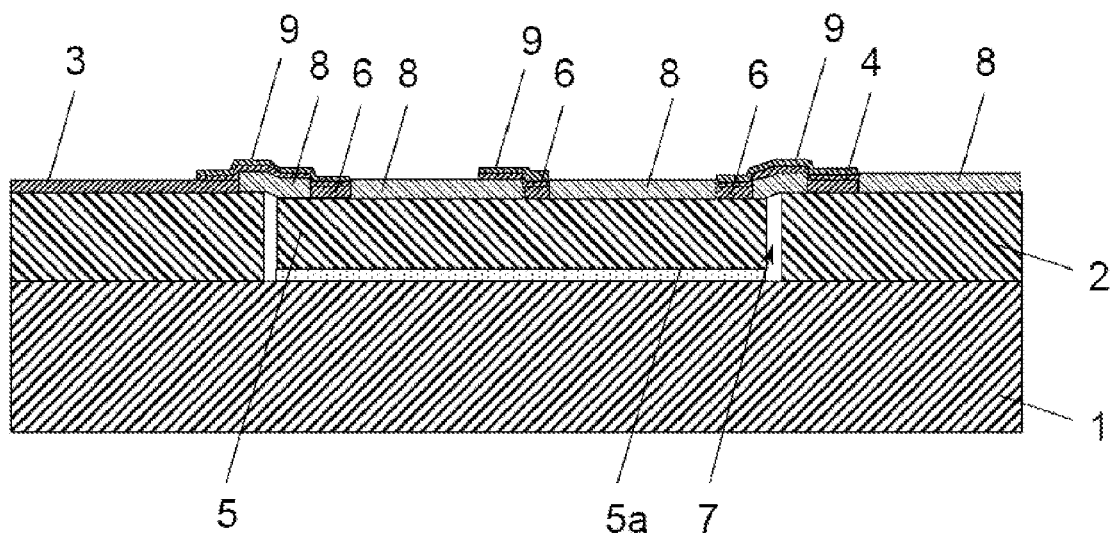
FIG. 5f shows an aspect of the galvanic deposition process in which removal of the galvanic substrate metallization which has not been electroplated is conducted.

FIGS. 5a-5d illustrate a method in which the electrically conducting material for the second electrical line is applied by galvanic deposition. FIG. 5a shows the module with structured second layer 8 before the plating process. A galvanic substrate metallization 11 is applied to the whole area of the second layer, as illustrated in FIG. 5b. A photostructured covering layer 12, having uncovered areas that are electroplatable areas, is applied as illustrated in FIG. 5c. The uncovered areas correspond to the gap areas, contacting areas 6 and contacting point 4. Electroplating of the uncovered areas is performed to generate electrical connecting lines 9, as illustrated in FIG. 5d. The covering layer is removed, as illustrated in FIG. 5e, and the galvanic substrate metallization which has not been electroplated is also removed, as illustrated in FIG. 5f.

Optionally, a further step S6 can be added. According to this step S6, after the galvanic deposition according to S5, the second layer 8 is removed by either a laser or a chemical solution. Removal by a chemical solution, e.g. organic solvents such as acetone, is inexpensive and can be done in a short time.

The electronic apparatuses and methods which are shown according to the exemplary embodiments should be seen only as examples, and do not restrict the range of protection. According to the proposed method and product, multiple (semiconductor) chips 5, electrical contacting areas 6, contacting points 4 and electrical connecting lines 9 can be or become generated. The number of (semiconductor) chips 5 is also not restricted. The term "at least" means one or more corresponding components. High frequency means a frequency range above about 200 MHz.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide V. DIRECTV*, 69 USPQ2d 1865 (Fed. Cir. 2004).

The invention claimed is:

1. A method for producing an electronic apparatus, comprising:
    forming a polymeric first layer on a substrate, the polymeric first layer having a lower surface facing the substrate and an upper surface opposite to the lower surface;
    securing an electronic component on the substrate and within a window in the polymeric first layer, the electronic component being formed in such a way that a gap area exists between the electronic component and the polymeric first layer, the electronic component having a contacting area;
    forming a first electrical line with an electrical contacting point on the upper surface of the polymeric first layer;
    forming a second layer on the electronic component, on the upper surface of the polymeric first layer and bridging over the gap area, in such a way that the contacting point and contacting area are freely accessible; and
    applying an electrically conducting material to the contacting area of the electronic component, to the second layer over the gap area and to the contacting point of the first electrical line to generate a second electrical line that provides a planar electrical connection between the contacting area and the contacting point.

2. The method as claimed in claim 1, wherein the second layer is a film of electrically insulating plastic material, which is applied over a whole area and opened over the contacting area and contacting point.

3. The method as claimed in claim 1, wherein the second layer is a photostructured layer, which is applied so that the contacting area and contacting point remain uncovered.

4. The method as claimed in claim 1, wherein
    the electrically conducting material for the second electrical line is applied by galvanic deposition,
    the second layer is removed after the electrically conducting material is applied, and
    the second layer is removed by a laser or an organic chemical solution.

5. The method as claimed in claim 1, wherein the electrically conducting material for the second electrical line is applied by galvanic deposition, in a process comprising:
   applying a galvanic substrate metallization to a whole area of the second layer,
   applying a photostructured covering layer having uncovered areas that are electroplatable areas, the uncovered areas corresponding to the gap area, the contacting area and the contacting point,
   electroplating the uncovered areas,
   removing the photostructured covering layer, and
   removing the galvanic substrate metallization which has not been electroplated.

6. The method as claimed in claim 1, wherein the height of the electronic component and the thickness of the polymeric first layer are approximately equal.

7. The method as claimed in claim 1, wherein the second layer has a high attenuation factor.

8. The method as claimed in claim 1, further comprising:
   forming a further electrical line that provides a connection from the electronic component to the substrate, from the electronic component to a passive component, or from a first electronic component to a second electronic component.

9. The method as claimed in claim 1, wherein a surface mounted device is integrated under the second layer.

10. The method as claimed in claim 1, wherein
    the second layer has an opening, and
    a surface mounted device is mounted within the opening in the second layer.

11. The method as claimed in claim 1, wherein
    electroplating is used to form the electrically conducting material of the second electrical line, and
    after electroplating the electrically conducting material, a third layer is applied.

12. The method as claimed in claim 1, wherein at least one further plane of electrical connecting lines is formed on the second layer.

13. The method as claimed in claim 1, wherein by applying the electrically conducting material to the contacting area and/or the contacting point, a distributed electronic component is generated.

14. The method as claimed in claim 1, wherein
    the electronic component is a semiconductor chip, and
    the window in the polymeric first layer is opened before the electronic component is secured on the substrate.

15. The method as claimed in claim 1, wherein
    the electronic component has a plurality of contacting areas,
    there are a plurality of first electrical lines, each with an electrical contacting point, and
    each contacting area is connected to a corresponding electrical contacting point with a respective second electrical line.

16. The method as claimed in claim 1, wherein
    a plurality of electrical components are formed side-by-side on the substrate with a gap area between each of the adjacent electrical components,
    each of the electrical components has a contacting area, and
    the contacting areas of adjacent electrical components are connected with a corresponding second electrical line.

17. The method as claimed in claim 1, wherein the apparatus is a high frequency module.

18. A high frequency module produced according to the method of claim 1.

* * * * *

UNITED STATES PATENT AND TRADEMARK OFFICE
CERTIFICATE OF CORRECTION

| | | |
|---|---|---|
| PATENT NO. | : 8,642,465 B2 | Page 1 of 1 |
| APPLICATION NO. | : 12/224608 | |
| DATED | : February 4, 2014 | |
| INVENTOR(S) | : Schimetta et al. | |

It is certified that error appears in the above-identified patent and that said Letters Patent is hereby corrected as shown below:

On the Title Page Item [75] (Inventors), Line 2, Delete "Maximilian Tschemitz," and insert
-- Maximilian Tschernitz --, therefor.

Signed and Sealed this
Twenty-seventh Day of May, 2014

Michelle K. Lee
*Deputy Director of the United States Patent and Trademark Office*